(12) United States Patent
Munenaga et al.

(10) Patent No.: US 9,059,663 B2
(45) Date of Patent: Jun. 16, 2015

(54) AUDIO OUTPUT CIRCUIT, ELECTRONIC DEVICE USING THE SAME, AND AUDIO INTEGRATED CIRCUIT

(71) Applicant: ROHM CO., LTD., Kyoto (JP)

(72) Inventors: Hideki Munenaga, Kyoto (JP); Takeshi Onodera, Kyoto (JP)

(73) Assignee: ROHM CO., LTD. (JP)

( * ) Notice: Subject to any disclaimer, the term of this patent is extended or adjusted under 35 U.S.C. 154(b) by 282 days.

(21) Appl. No.: 13/793,317

(22) Filed: Mar. 11, 2013

(65) Prior Publication Data

US 2013/0236034 A1    Sep. 12, 2013

(30) Foreign Application Priority Data

Mar. 9, 2012    (JP) .................................. 2012-53632

(51) Int. Cl.
*H03F 99/00*     (2009.01)
*H03F 3/00*      (2006.01)
*H03F 3/217*     (2006.01)

(52) U.S. Cl.
CPC ................ *H03F 3/00* (2013.01); *H03F 3/2173* (2013.01)

(58) Field of Classification Search
None
See application file for complete search history.

(56) References Cited

U.S. PATENT DOCUMENTS 3,662,641 A * 5/1972 Allen et al. ..................... 84/722
2010/0067877 A1 * 3/2010 Ichimura et al. ................ 386/96

FOREIGN PATENT DOCUMENTS

JP    2001223537 A    8/2001

* cited by examiner

*Primary Examiner* — Paul Huber
(74) *Attorney, Agent, or Firm* — Cantor Colburn LLP (57) ABSTRACT

An audio output circuit for driving an electro-acoustic transducer includes first and second D-class amplifiers, a pulse modulator to receive an audio signal and generate first and second pulse signals for driving first and second D-class amplifiers, first and second drivers to drive first and second D-class amplifiers in response to first and second pulse signals, respectively, a common mode choke coil, and a delay setting circuit to apply a relative delay to output signals of the first and second D-class amplifiers.

16 Claims, 12 Drawing Sheets

AUDIO OUTPUT CIRCUIT, ELECTRONIC DEVICE USING THE SAME, AND AUDIO INTEGRATED CIRCUIT

CROSS-REFERENCE TO RELATED APPLICATION

The present application claims priority under 35 U.S.C. §119 to Japanese Patent Application No. 2012-53632, filed on Mar. 9, 2012, the entire contents of which are incorporated herein by reference.

TECHNICAL FIELD

The present disclosure relates to an audio output circuit for driving speakers or headphones.

BACKGROUND

Figure 1:
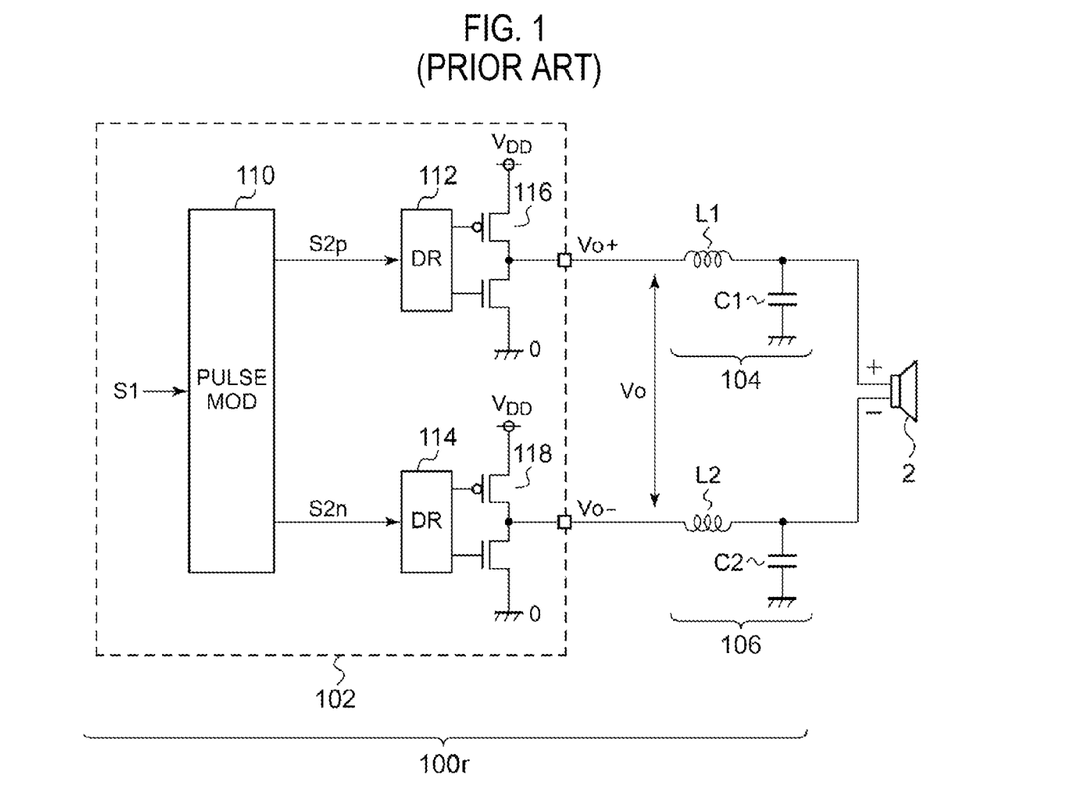
FIG. 1 is a conventional circuit diagram showing a configuration of an audio output circuit including a D-class amplifier.

An audio output circuit is used for amplifying a weak audio signal to drive an electro-acoustic transducer such as a speaker or a headphone. FIG. 1 is a conventional circuit diagram showing a configuration of an audio output circuit 100r including a D-class amplifier D. The audio output circuit 100r includes a pulse modulator 110, a first driver 112, a second driver 114, a first D-class amplifier 116, and a second D-class amplifier 118. The pulse modulator 110 pulse-width modulates or pulse-density modulates an audio signal S1. Pulse-modulated audio signals (hereinafter, referred to as pulse signals) S2p and S2n are input to the first driver 112 and the second driver 114, respectively.

An electro-acoustic transducer 2, which is a load, is BTL (Bridge Transless) connected to the first D-class amplifier 116 and the second D-class amplifier 118. A first filter 104 is inserted between a positive terminal (+) of the electro-acoustic transducer 2 and an output of the first D-class amplifier 116), and a second filter 106 is inserted between a negative terminal (−) of the electro-acoustic transducer 2 and an output of the second D-class amplifier 118. Each of the filters 104 and 106 is a primary filter including a series inductor L1 (L2) and a shunt capacitor C1 (C2).

The first driver 112 switches a high-side transistor and a low-side transistor of the first D-class amplifier 116 complementarily in response to the pulse signal S2P. Similarly, the second driver 114 switches a high-side transistor and a low-side transistor of the second D-class amplifier 118 complementarily in response to the pulse signal S2n.

Figure 2:
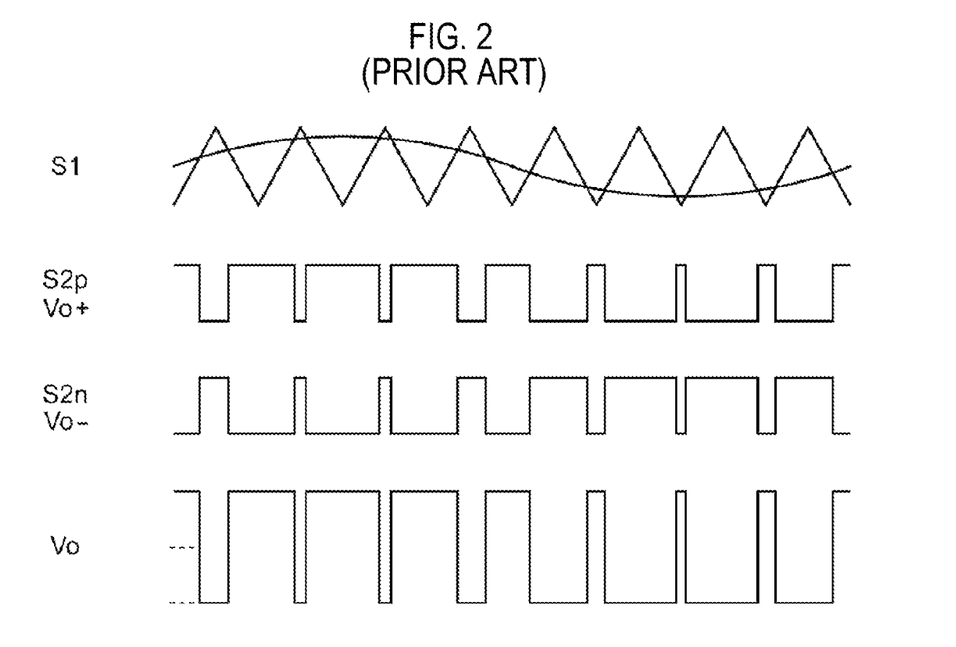
FIG. 2 shows waveform diagrams at the time of a differential operation of the audio output circuit shown in FIG. 1.

FIG. 2 shows waveform diagrams in a differential operation of the audio output circuit 100r shown in FIG. 1. Horizontal axes and vertical axes of waveform diagrams and timing charts in the present disclosure may be enlarged or reduced, and each waveform may also be simplified as appropriate for ease of understanding.

A case where the pulse signals S2p and S2n are generated by comparing a triangular wave and the audio signal S1 is described with reference to FIG. 2. The pulse signals S2p and S2n are reverse phased in the D-class amplifiers 116 and 118. Therefore, an amplitude of a differential signal Vo (=Vo$_+$−Vo$_-$) determined based on output voltages Vo$_+$ and Vo$_-$ is twice a power supply voltage VDD of the first D-class amplifier 116 and the second D-class amplifier 118

The first filter 104 and the second filter 106 function as low pass filters to reproduce the original audio signal S1 by removing a switching frequency of the differential signal Vo.

Figure 3:
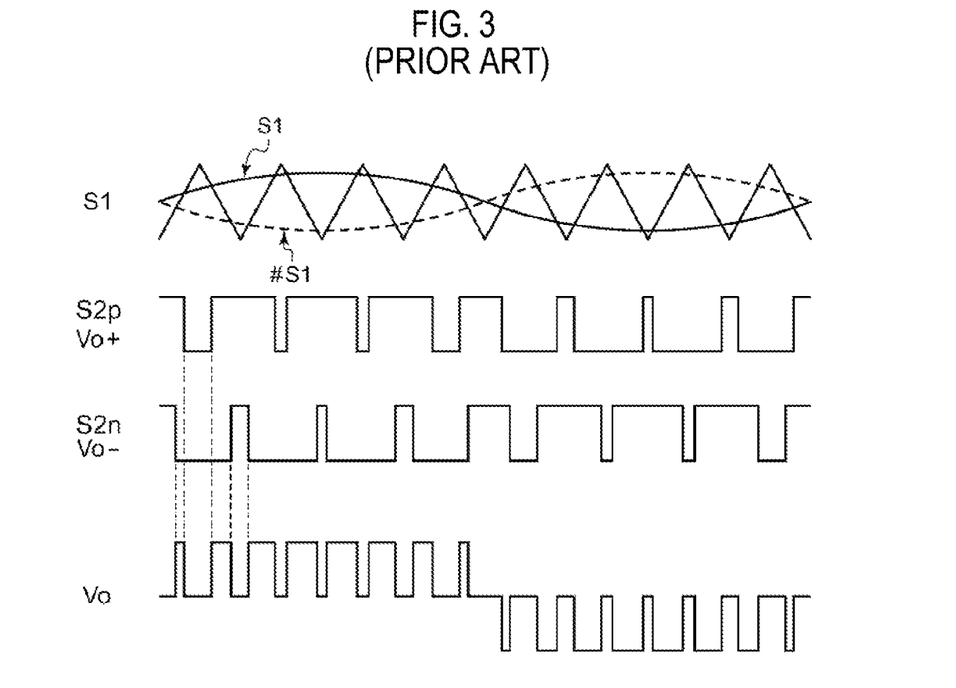
FIG. 3 shows waveform diagrams at the time of a filterless operation of the audio output circuit shown in FIG. 1.

Recently, a filterless operation has been adopted instead of the differential operation of the audio output circuit 100r described in FIG. 2. FIG. 3 shows waveform diagrams when the filterless operation of the audio output circuit 100r of FIG. 1 is performed. The pulse signal S2p is generated by comparing the audio signal S1 and the triangular wave and the pulse signal S2n is generated by comparing an inversion signal #S1 of the audio signal S1 and the triangular in the filterless operation. The amplitude of the differential signal Vo applied to the electro-acoustic transducer 2 is half the amplitude of the case where the differential operation is performed. This method is referred to as the filterless operation or a filterless method, since it needs no low pass filter for removing the switching frequency of the differential signal Vo. However, for the purpose of suppressing a spurious radiation (EMI: Electromagnetic Interference), the first filter 104 and the second filter 106 are adopted to function as EMI-removing filters.

SUMMARY

Generally, a component referred to as a power inductor is adopted for the series inductors L1 and L2 of the filters 104 and 106 in the filterless type audio output circuit 100r. The power inductor has an area of at least 25 mm$^2$ (=5 mm×5 mm). Generally, a total of 4 power inductors (2 for a left channel and 2 for a right channel) are required in the filterless type output circuit 100r. Therefore, a mounting area of the power inductors becomes 4×25 mm$^2$, thus increasing a total area occupied by the audio output circuit 100r on a printed substrate.

Various embodiments are provided in the present disclosure in view of the problem as described above, and include at least one embodiment for the miniaturization of an audio output circuit.

Some embodiments of the present disclosure relate to an audio output circuit for driving an electro-acoustic transducer. The audio output circuit includes a first D-class amplifier, a second D-class amplifier, a pulse modulator configured to receive an audio signal to generate a first pulse signal and a second pulse signal for driving the first D-class amplifier and the second D-class amplifier, respectively, a first driver configured to drive the first D-class amplifier in response to the first pulse signal, a second driver configured to drive the second D-class amplifier in response to the second pulse signal, a common mode choke coil including a first coil whose one end is connected to an output terminal of the first D-class amplifier and the other end is connected to a positive terminal of the electro-acoustic transducer, a second coil whose one end is connected to an output terminal of the second D-class amplifier and the other end is connected to a negative terminal of the electro-acoustic transducer, and a core around which the first coil and the second coil are wound, and a delay setting circuit configured to apply a relative delay to the output signal of the first D-class amplifier and the output signal of the second D-class amplifier.

According to some embodiments, distortion imposed on two output signals due to the common mode choke coil can be compensated by controlling a relative delay of the output signal of the first D-class amplifier and the output signal of the second D-class amplifier so that possible degradation of sound quality can be suppressed. In addition, two power inductors can be replaced with one common mode choke coil, thus reducing the number of components and the area occupied by the components.

The delay setting circuit may set the delay so as to reduce a total harmonic distortion+noise (THD+N). When the delay varies, an EMI and the total harmonic distortion+noise (THD+N) vary. High-quality sound can be realized by setting the delay so as to reduce the THD+N as much as possible in a range where the EMI meets a desired specification.

The delay setting circuit may change the delay depending on the level of the audio signal. An optimal delay to reduce the distortion introduced in the audio signal may depend on the level of the audio signal. In this case, the high-quality sound can be realized by adaptively varying the delay in response to the level of the audio signal.

The audio output circuit may further include a level meter that detects a level of the audio signal. The delay setting circuit may set the delay in accordance with the detection result of the level meter.

The audio output circuit is provided ahead of the pulse modulator, and may further include a volume circuit that changes an amplitude of the audio signal depending on a set volume level. The delay setting circuit may set the delay depending on the volume level.

The audio output circuit may further include an interface circuit that receives data indicating the delay from an external processor and a register that stores the received data. The delay setting circuit may set the delay based on the data stored in the register.

An upper limit of a range within which the delay is adjustable may be 100 ns or more.

A lower limit of the range within which the delay is adjustable is 0 ns, and the upper limit may be 300 ns or more.

The audio output circuit may include a first capacitor whose one end is connected to a positive terminal of the electro-acoustic transducer and the other end is grounded and a second capacitor whose one end is connected to a negative terminal of the electro-acoustic transducer and the other end is grounded.

The audio output circuit may further include a third capacitor whose one end is connected to the positive terminal of the electro-acoustic transducer and the other end is connected to the negative terminal of the electro-acoustic transducer.

The audio output circuit may further include a digital sound processor which is provided ahead of the pulse modulator and configured to perform at least one of equalizing, low-frequency emphasizing, surrounding, stereo converting, mono converting, frequency converting, and level detecting processes on the audio signal.

Some embodiments of the present disclosure relate to an electronic device. The electronic device may include an electro-acoustic transducer and any one of the above-described audio output circuits for driving the electro-acoustic transducer.

The electronic device may further include a sound source to generate an audio data. The audio output circuit may generate the audio signal based on the audio data.

Some embodiments of the present disclosure relate to an audio integrated circuit. The audio integrated circuit, along with a common mode choke coil, constitutes an audio output circuit that drives an electro-acoustic transducer. The common mode choke coil includes a first coil whose one end is connected to the positive terminal of the electro-acoustic transducer, a second coil whose one end is connected to the negative terminal of the electro-acoustic transducer, and a core around which the first coil and the second coil are wound. The audio integrated circuit includes a first D-class amplifier whose output terminal is connected to the other end of the first coil, a second D-class amplifier whose output terminal is connected to the other end of the second coil, a pulse modulator configured to receive an audio signal to generate a first pulse signal and a second pulse signal for driving the first D-class amplifier and the second D-class amplifier, respectively, a first driver configured to drive the first D-class amplifier in response to the first pulse signal, a second driver configured to drive the second D-class amplifier in response to the second pulse signal, and a delay setting circuit configured to apply a relative delay to an output signal of the first D-class amplifier and an output signal of the second D-class amplifier.

In addition, any combination of components described above, and any method, apparatus (device) or the like representing the various embodiments of the present disclosure are also effective as an embodiment of the present disclosure.

BRIEF DESCRIPTION OF THE DRAWINGS

The accompanying drawings, which are incorporated in and constitute a part of the specification, illustrate various embodiments of the present disclosure, and together with the general description given above and the detailed description given below, serve to explain the principles of the present disclosure.

FIGS. 7A and 7B show waveforms of load voltage $V_{load}$, where FIG. 7A illustrates the load voltage when a delay $\tau$ is not applied and FIG. 7B illustrates the load voltage when an appropriate delay $\tau$ is applied, according to some embodiments.

DETAILED DESCRIPTION

Various embodiments of the present disclosure will now be described in detail with reference to the drawings. Throughout the drawings described herein below, identical or similar components, members, and processes will be designated by identical reference symbols, and duplicate descriptions will be omitted. Further, these embodiments have been presented by way of example only, and are not intended to limit the scope of the disclosures.

As used herein, "a state in which a member A is connected with a member B" includes not only a case in which the member A and the member B are directly connected physically, but also a case in which the member A is connected to the member B indirectly via another member which does not substantially affect the electrical connection status. Similarly, "a state in which a member C is provided between a member A and a member B" includes not only a case in which the member C is directly connected with the member A or the member B, but also a case in which the member C is indirectly connected with the member A or the member B via another member which does not substantially affect the electrical connection status.

Figure 4:
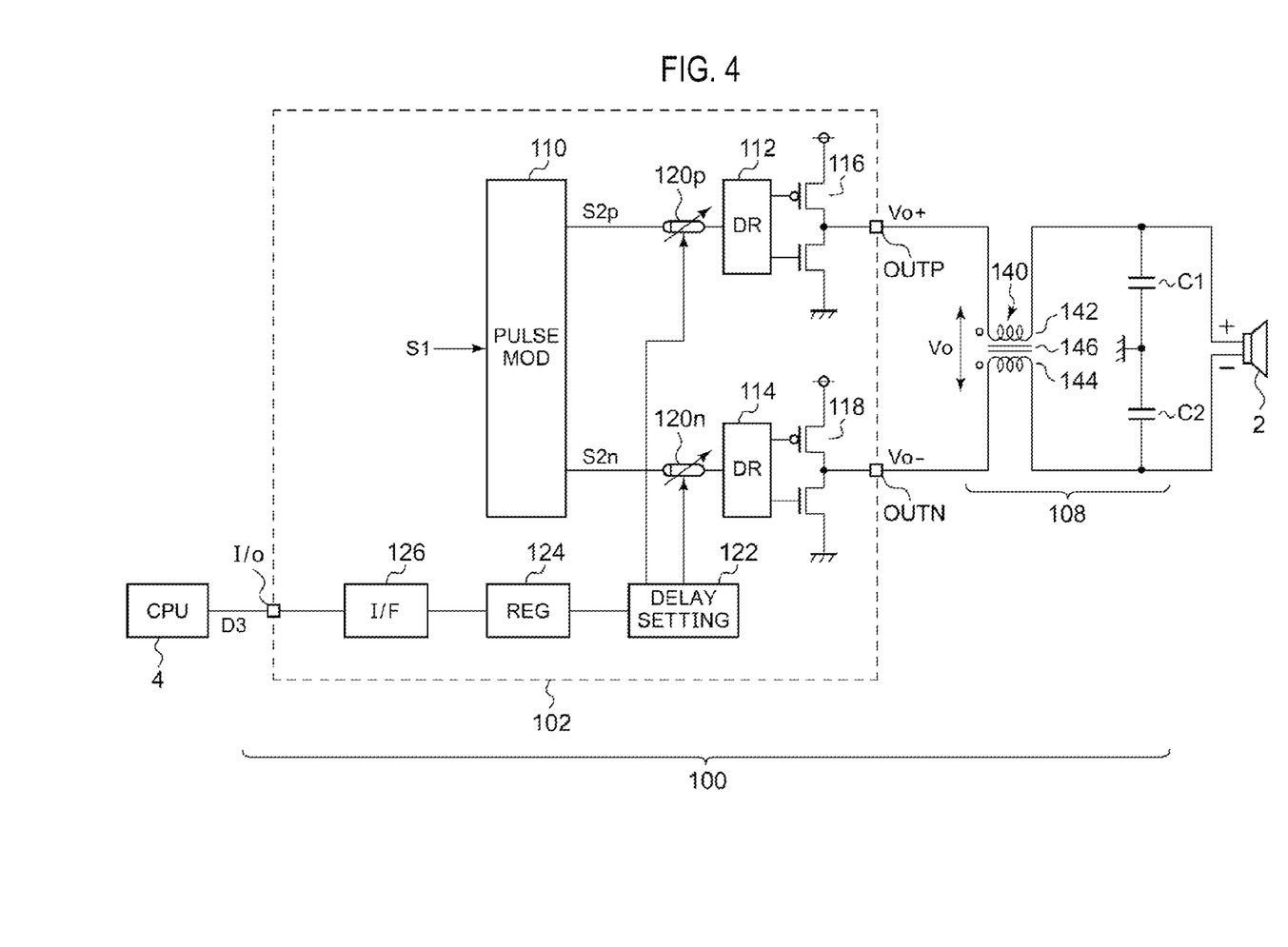
FIG. 4 is a circuit diagram showing a configuration of an audio output circuit, according to some embodiments of the present disclosure.

FIG. 4 is a circuit diagram showing a configuration of an audio output circuit 100, according to some embodiments. The audio output circuit 100 drives the electro-acoustic transducer 2. The audio output circuit 100 is a filterless type audio output circuit, which includes an audio IC 102 and an output filter 108.

The audio IC 102 is a functional IC integrated on a single semiconductor substrate, and includes output terminals OUTP and OUTN and a data input and output terminal I/O.

The output filter 108 includes a common mode choke coil 140, a first capacitor C1, a second capacitor C2. The common mode choke coil 140 has a first coil 142, a second coil 144 and a core 146. The first coil 142 and the second coil 144 are wound around the common core 146. One end of the first coil 142 is connected to the first output terminal OUTP and the other end is connected to a positive terminal (+) of the electro-acoustic transducer 2. In addition, one end of the second coil 144 is connected to the second output terminal OUTN and the other end is connected to a negative terminal (−) of the electro-acoustic transducer 2. The first capacitor C1 is provided between the positive terminal (+) of the electro-acoustic transducer 2 and a grounding terminal, and the second capacitor C2 is provided between the negative terminal (−) of the electro-acoustic transducer 2 and the grounding terminal. The output filter 108 is provided to reduce spurious radiation (EMI).

The audio IC 102 includes a pulse modulator 110, a first driver 112, a second driver 114, a first D-class amplifier 116, a second D-class amplifier 118, variable delay circuits 120p and 120n, a delay setting circuit 122, a register 124, and an interface circuit 126.

The pulse modulator 110 receives an audio signal S1. The pulse modulator 110 pulse-modulates the audio signal S1 and generates a first pulse signal S2p and a second pulse signal S2n for driving the first D-class amplifier 116 and the second D-class amplifier 118, respectively. The pulse modulator 110 is not particularly limited in its configuration and modulation method. The pulse modulator 110 may be a ΔΣ modulator. The pulse modulator 110 may employ a pulse width modulation method that slices a saw tooth of a triangular wave at a level of the audio signal S1 to generate the pulse signals S2p and S2n.

The first driver 112 drives the first D-class amplifier 116 in response to the first pulse signal S2p. In the same manner, the second driver 114 drives the second D-class amplifier 118 in response to the second pulse signal S2n.

The delay setting circuit 122 applies a relative delay τ to the output signal Vo₊ of the first D-class amplifier 116 and the output signal Vo− of the second D-class amplifier 118. The variable delay circuits 120p and 120n are configured to apply the relative delay τ. The variable delay circuit 120p is provided on a path for the first pulse signal S2p, and the variable delay circuit 120n is provided on a path for the second pulse signal S2n, in some embodiments. In FIG. 4, the variable delay circuits 120p and 120n are illustrated, but one of them may be omitted, according to some other embodiments. The variable delay circuits 120p and 120n may be built in the first driver 112 and the second driver 114, respectively. Alternatively, the variable delay circuits 120p and 120n may be built in the pulse modulator 110. The variable delay circuits 120p and 120n may be analog delay circuits or digital delay circuits.

The delay setting circuit 122 controls a delay operation of the variable delay circuit 120p and 120n. The delay τ may be set by an external CPU (Central Processing Unit; 4) in some embodiments.

The CPU 4 and the I/O terminal of the audio IC 102 are connected through an I²C bus. The CPU 4 generates data D3 indicating the delay τ, and sends it to the audio IC 102 through the I²C bus. The interface circuit 126 receives the data D3 from the CPU 4 and writes it in the register 124. The delay setting circuit 122 sets an amount of delay for each of the variable delay circuits 120p and 120n in response to the data D3 written in the register 124, to provide the relative delay τ for the first pulse signal S2p and the second pulse signal S2n. As will be described later in detail, the delay τ is determined so as to reduce the total harmonic distortion+noise (THD+N).

An operation of the audio output circuit 100 is described, recognized the following problems with regard to using the common mode choke coil 140 in the audio output circuit 100. The recognition shall not be considered as general technical knowledge of a person skilled in the art.

Figure 5:
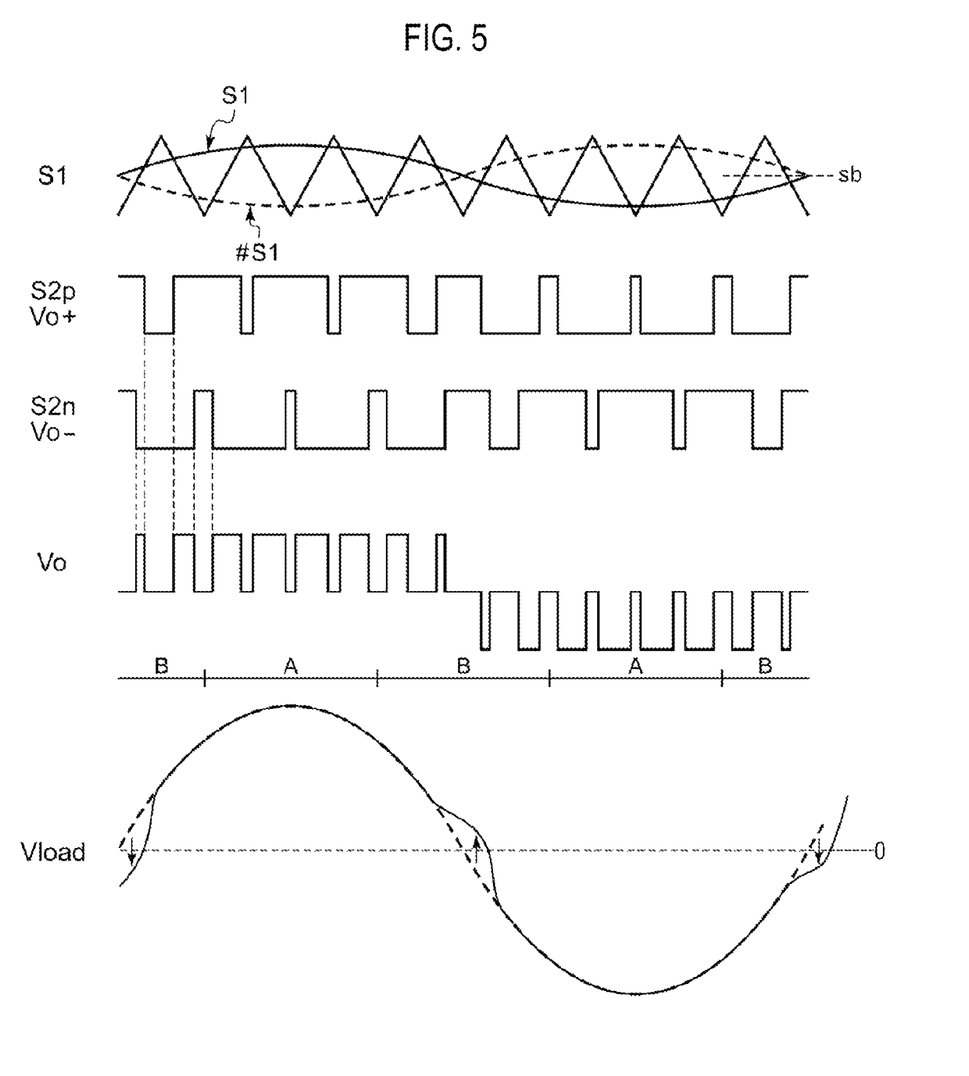
FIG. 5 shows waveform diagrams illustrating an operation of the audio output circuit using a common mode choke coil.

FIG. 5 shows waveform diagrams illustrating an operation of the audio output circuit 100 using the common mode choke coil 140. In FIG. 5, the relative delay τ provided by the variable delay circuits 120p and 120n is zero. In a filterless operation of the audio output circuit 100, a balance of a differential component and an in-phase component between the first pulse signal S2p (Vo₊) and the second pulse signal S2n (Vo−) varies in response to a level of the audio signal S1. In other words, the differential components of the first pulse signal S2p and the second pulse signal S2n increase when the level of the audio signal S1 is far from a center level (bias level Sb) ("A" in FIG. 5), while the in-phase components of the first pulse signal S2p and the second pulse signal S2n increase when the audio signal S1 is near to the center level ("B" in FIG. 5).

The common mode choke coil 140 acts to cancel the in-phase components of the first coil 142 and the second coil 144. Therefore, when the in-phase components are dominant (i.e. the audio signal S1 is near to the center level) in the filterless audio output circuit 100, the in-phase components of the output signals Vo₊ and Vo− are cancelled so that a voltage $V_{load}$ applied to the electro-acoustic transducer 2, which is a load, is distorted near a zero-crossing.

Figure 6A:
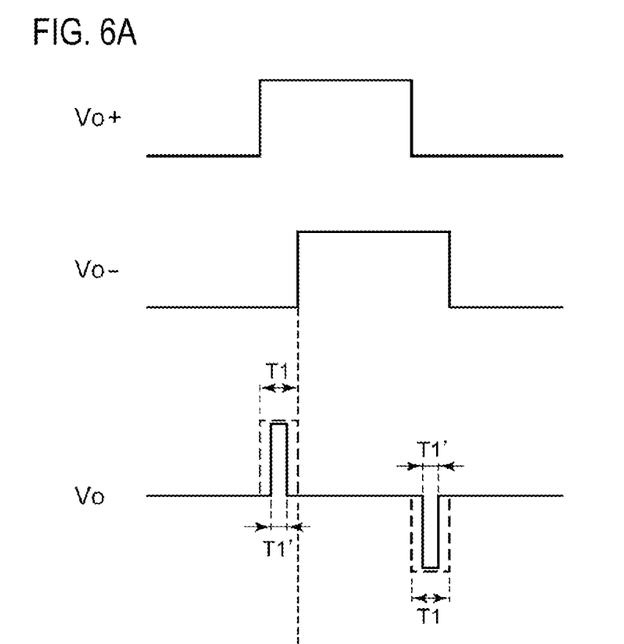
FIGS. 6A and 6B show waveform diagrams illustrating situations where the distortion has been reduced by the audio output circuit, according to some embodiments.
Figure 6B:
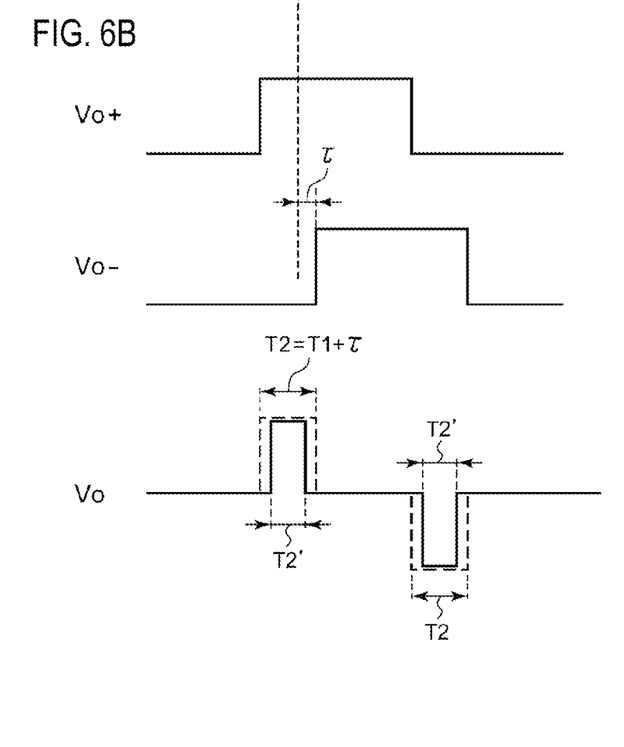

The audio output circuit 100, according to some embodiments, reduces the distortion near the zero-crossing by setting the delay τ. FIGS. 6A and 6B show waveform diagrams for illustrating how the distortion is reduced by the audio output circuit 100, according to some embodiments. It should be noted that the waveforms of FIGS. 6A and 6B show an operation of the common mode choke coil 140 conceptually and are different from actual waveforms.

FIG. 6A shows the waveforms when the delay τ is zero. A broken line of the differential signal Vo represents the waveform when the in-phase components are not removed by the common mode choke coil 140, and the solid line represents the waveform when the in-phase components are removed. The removal of the in-phase components is equivalent to reducing a pulse width of the differential signal Vo from T1 to T1′. When the in-phase components are removed so the pulse width is reduced, the load voltage $V_{load}$ decreases to distort the waveform.

FIG. 6B shows the waveforms when an appropriate delay τ is provided to the output signal Vo−. The pulse width T2 of the waveform Vo (broken line) before the removal of the in-phase components becomes T1+τ by applying the delay τ. The pulse width T2 is reduced to the pulse width T2' when the in-phase components are removed by the common mode choke coil 140. Therefore, the waveform distortion can be suppressed by setting the delay τ so that the reduced pulse width T2 may be equal to the pulse width T1 of FIG. 6A.

According to the audio output circuit 100, following effects may be obtained.

(First Effect)

Two power inductors are required in the audio output circuit 100r of FIG. 1. However, one common mode choke coil 140 may be used in the audio output circuit 100, according to some embodiments, thus reducing the number of components. In addition, the common mode choke coil 140 is smaller than the power inductor. More specifically, the power inductor currently obtainable in the market has a size of 25 mm$^2$ and two power inductors are required in the audio output circuit 100r of FIG. 1, whereas the common mode choke coil 140 has a size of 16 mm$^2$ (=4 mm×4 mm). Thus, it is possible to reduce a mounting area of the audio output circuit 100, enabling miniaturization thereof.

(Second Effect)

Figure 7A:
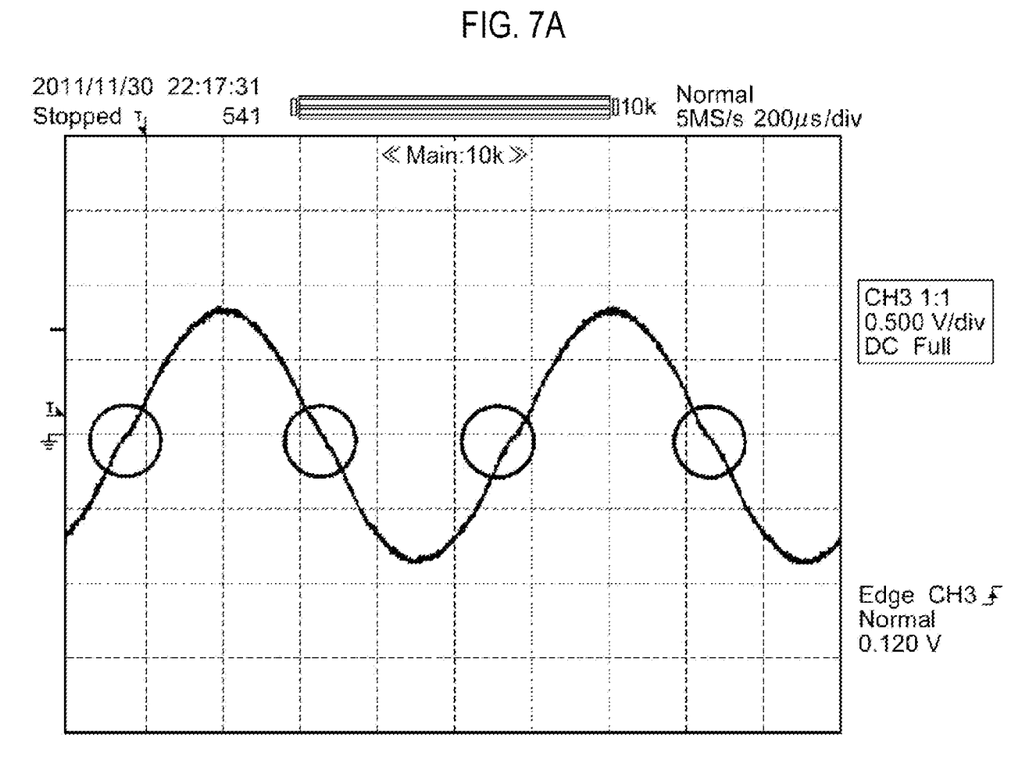
Figure 7B:
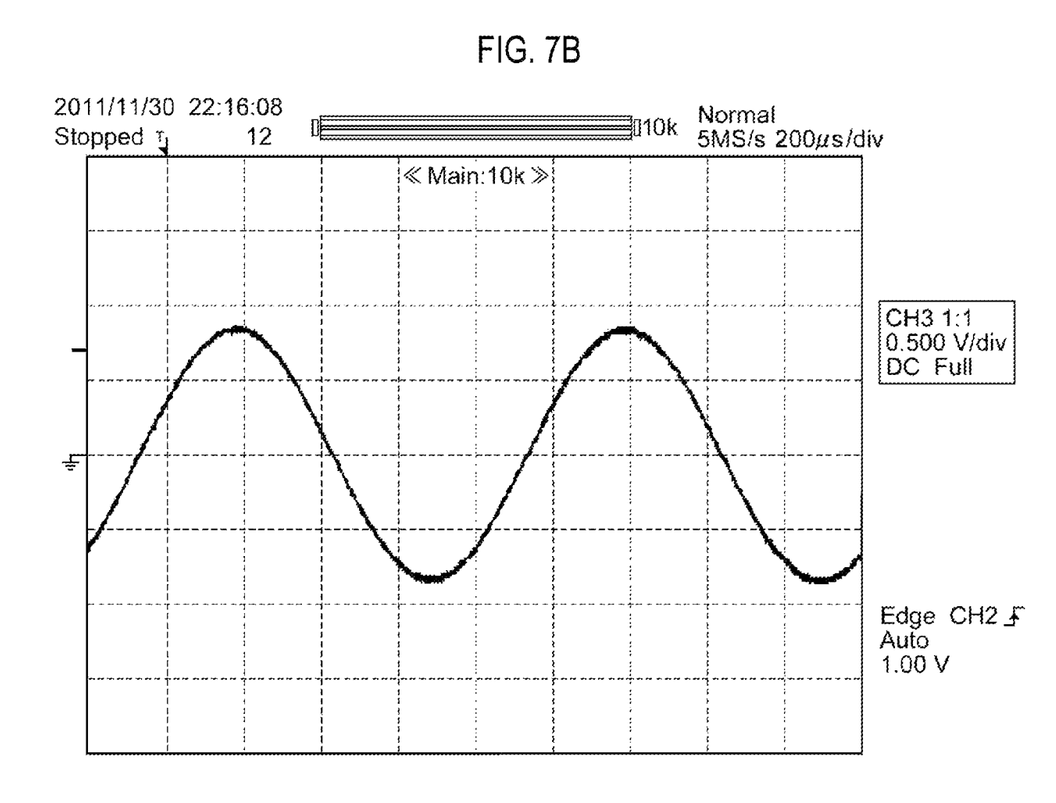

In addition, an audio signal of high quality may be reproduced in the audio output circuit 100 by controlling an amount of delay to optimize the delay. FIG. 7A is a waveform diagram showing the load voltage $V_{load}$ when the delay τ is not applied, and FIG. 7B is a waveform diagram showing the load voltage $V_{load}$ when the appropriate delay τ is applied. FIGS. 7A and 7B are captured waveform diagrams of the load voltage $V_{load}$ of an actual audio output circuit 100, which was measured by an oscilloscope. The measurement was carried out under the condition that a power supply voltage VDD=12V, an audio signal frequency f=1 kHz, a load impedance $R_L$=8Ω, and an output power Po=10 mW. The capacitance value of the first capacitor C1 and the second capacitor C2 is 1000 pF.

A waveform distortion occurs near the zero-crossing due to the common mode choke coil 140 when the delay τ is not applied, as shown in FIG. 7A. On the other hand, the waveform distortion near the zero-crossing can be improved by applying an appropriate delay τ, as shown in FIG. 7B.

Figure 8:
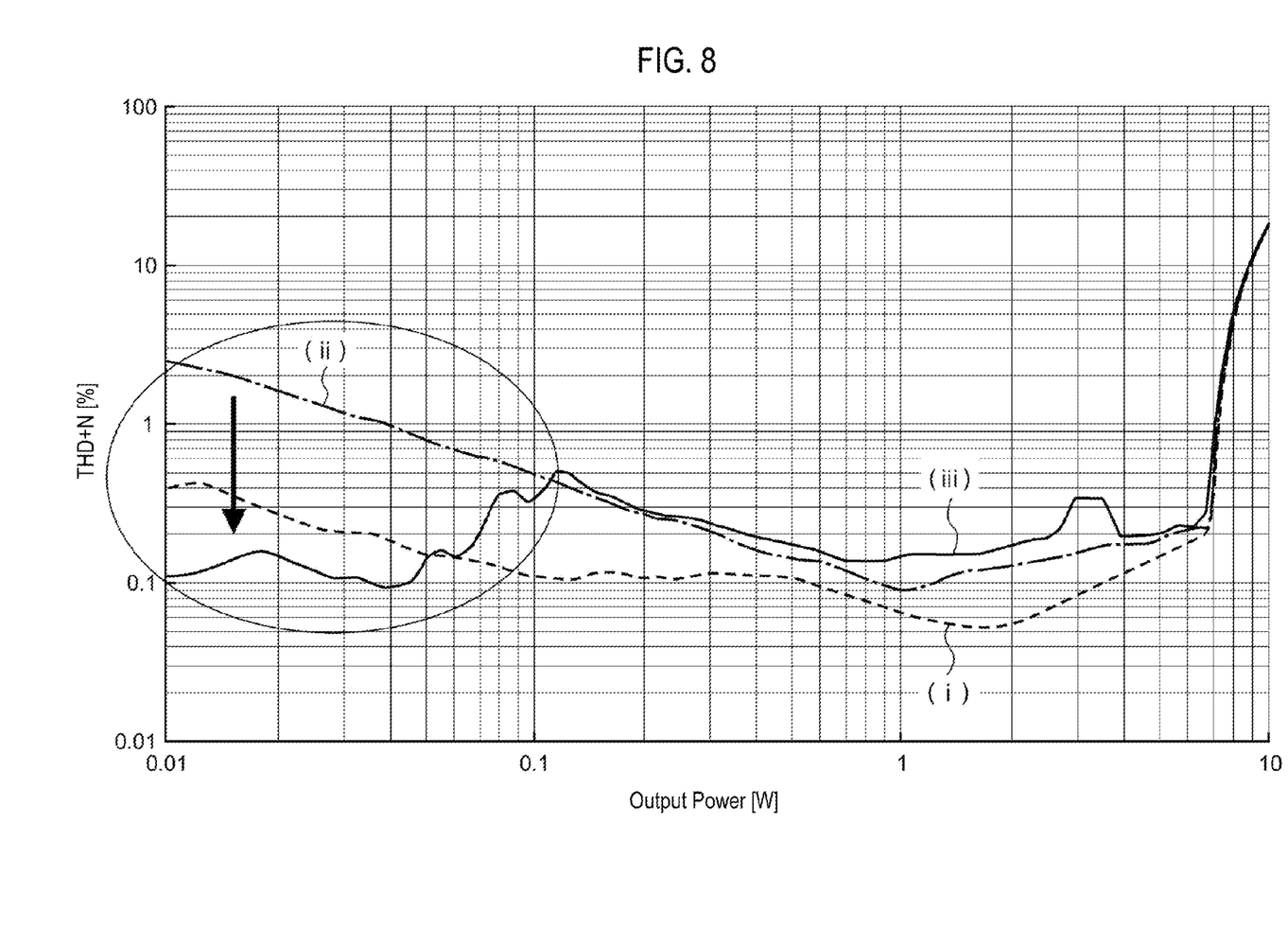
FIG. 8 is a diagram showing a relationship between an output power and a total harmonic distortion+noise, according to some embodiments.

"Total harmonic distortion+noise (THD+N)" is known as one of indicators showing a quality of an output audio signal of the audio output circuit 100. FIG. 8 is a diagram showing a relationship between an output power and the total harmonic distortion+noise of the output audio signal. In FIG. 8, (i) shows a characteristic of the audio output circuit 100r using the power inductor of FIG. 1, (ii) shows a characteristic when the common mode choke coil 140 is used, but the delay control is not performed, and (iii) shows a characteristic when the delay control is performed using the common mode choke coil 140. The measurement is performed in a band of 20 Hz to 20 kHz under the condition that the power supply voltage VDD=12 V, the audio signal frequency f=1 kHz, and the load impedance $R_L$=8 Ω.

As shown by the characteristic (ii), when the common mode choke coil 140 is used without the delay control, the value of THD+N at a low output power deteriorates significantly, compared with the characteristic (i) where the power inductor is used. On the other hand, THD+N at the low output power when the common mode choke coil 140 is used can be improved by performing the delay control.

Figure 9:
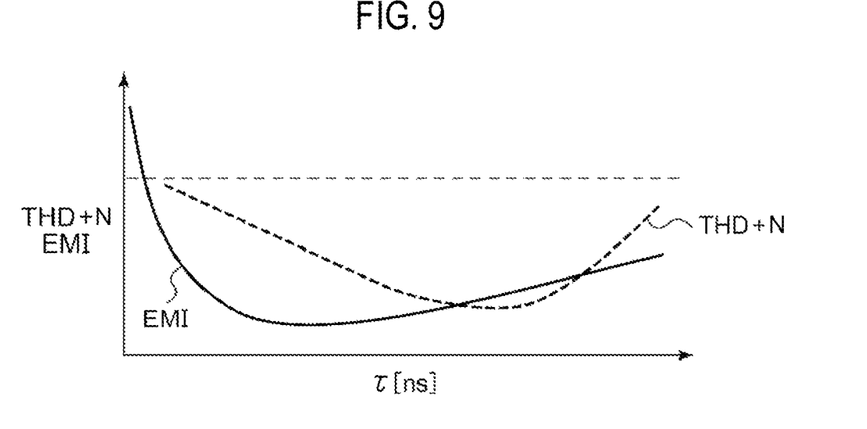
FIG. 9 is a diagram showing a relationship between the delay $\tau$ and the THD+N (and between the delay $\tau$ and the EMI), according to some embodiments.

Subsequently, a range of the delay τ will be described. FIG. 9 is a diagram showing a relationship between the delay τ and THD+N (and between the delay τ and the EMI). The spurious radiation EMI and THD+N vary with the variation of the delay τ as shown in FIG. 9. It is sufficient that the EMI is less than an upper limit (a dashed line) specified in a specification. On the other hand, the smaller THD+N is, the more desirable it is. Therefore, the delay τ may be optimized so that THD+N can be reduced as much as possible within a range where the EMI meets the specification. The optimum delay τ takes different values depending on a type of the common mode choke coil 140, a capacitance value of the first capacitor C and a capacitance value of the second capacitor C2, a power supply voltage VDD, a level of the audio signal S1 and so forth. Therefore, it would be desirable for designers of the audio output circuit 100 to estimate the optimal delay τ in advance based on simulation or actual measurement.

When only EMI is considered, it is sufficient that an absolute value of the delay τ (hereinafter simply referred to as the delay) is, for example, in the order of tens of ns. However, the delay τ required to obtain an audio signal with high quality may be 100 ns or more depending on the performance of the common mode choke coil 140. The upper limit of the range within which the delay τ is adjustable may be 100 ns or more. Further, the optimal delay τ may vary depending on the output power Po, or the delay of 300 ns or more may be required. Each of the variable delay circuits 120p and 120n may be configured to have the delay τ whose lower limit may be 0 ns and the upper limit may be 300 ns or more.

The present disclosure has been described based on various embodiments. It will be understood by persons skilled in the art that those embodiments have been presented by way of examples, various modifications may also be available to the combination of each component or each processing of those embodiments, and those modifications would also fall within the scope and spirit of the disclosure. Some modifications will be described as below.

(First Modification)

Figure 10:
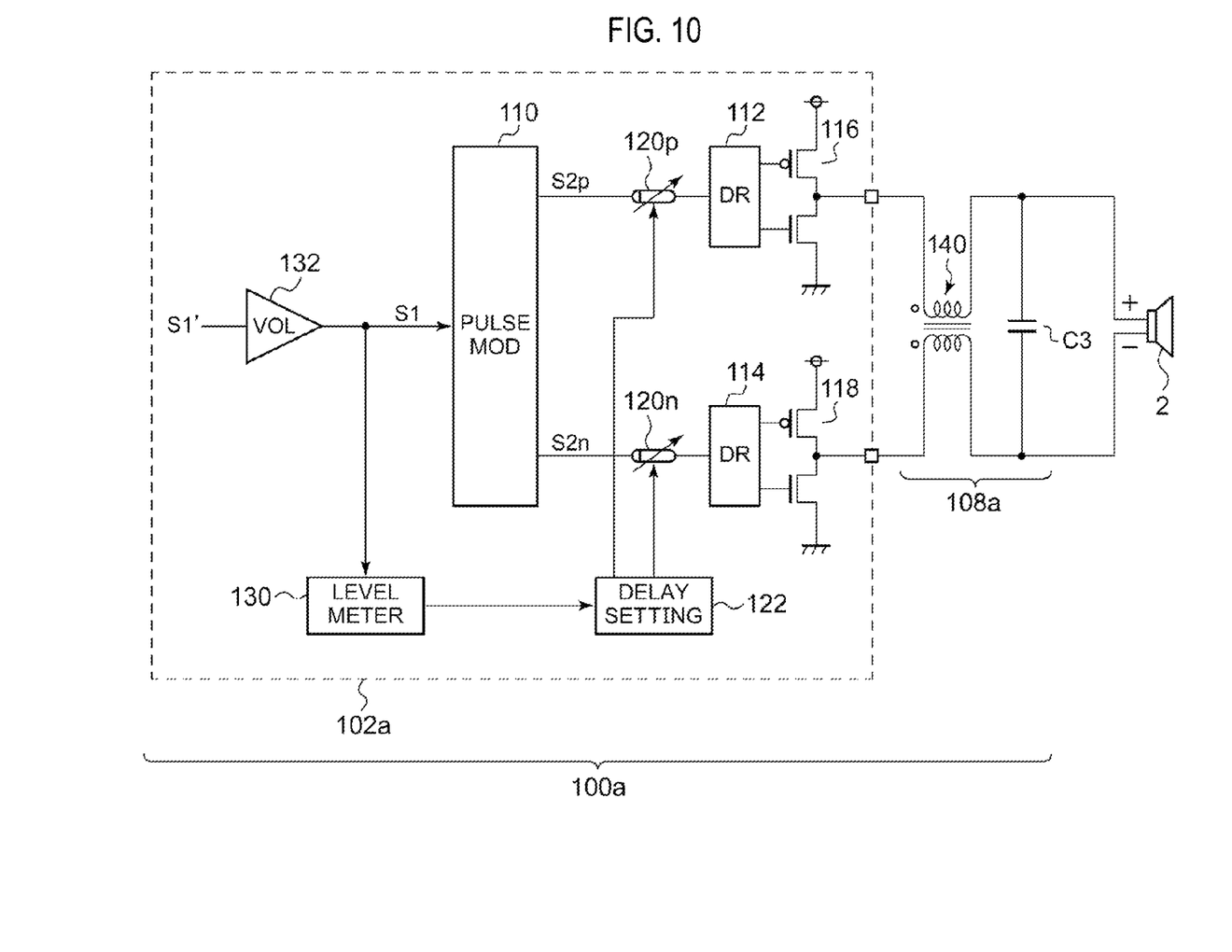
FIG. 10 is a circuit diagram showing a configuration of the audio output circuit, according to some embodiments.

FIG. 10 is a circuit diagram showing a configuration of an audio output circuit 100a according to a first modification. The optimal delay τ that gives good THD+N may vary depending on the output power, as described above. The delay setting circuit 122 in the audio output circuit 100a changes the delay τ depending on the level of the audio signal S1.

The audio IC 102a includes a level meter 130 and a volume circuit 132 in addition to the audio IC 102 of FIG. 4. The volume circuit 132 receives an audio signal S1' from the preceding stage and multiplies it by a coefficient corresponding to a volume level to adjust a level (amplitude) of the audio signal S1. The level meter 130 detects the level of the audio signal S1 input to the pulse modulator 110.

The original level of the audio signal S1' varies at times, and the level of the audio signal S1 varies accordingly. In addition, even in case of the audio signal SF of the same level, the level of the audio signal S1 varies, if the volume level of the volume circuit 132 varies. It is possible to regenerate an output audio signal of high quality in a wide range of the output power Po by detecting the level of the audio signal S1 with the use of the level meter 130 and setting the delay τ depending on the result of the detection.

The optimal delay τ for each output power Po, or each level of the audio signal S1 may be obtained in advance based on a simulation or an actual measurement.

In addition, FIG. 10 shows an output filter 108a which is a modification of the output filter 108 of FIG. 4. The output filter 108a of FIG. 10 includes a third capacitor C3 in place of the first capacitor C1 and the second capacitor C2 of FIG. 4. The third capacitor C3 is provided between a positive terminal (+) and a negative terminal (−) of the electro-acoustic transducer 2. Also, in the audio IC 102 of FIG. 4, the output filter 108a of FIG. 10 may also be used in place of the output filter 108. Further, the third capacitor C3 may be combined with the first capacitor C1 and the second capacitor C2.

(Second Modification)

When an amplitude of the audio signal S1' is controlled to be substantially constant in the audio output circuit 100a of FIG. 10, the level of the audio signal S1 is mainly dependent on the volume level of the volume circuit 132. In this case, the level meter 130 may be omitted, and the delay setting circuit 122 may set the delay τ according to the volume level of the volume circuit 132.

Figure 11:
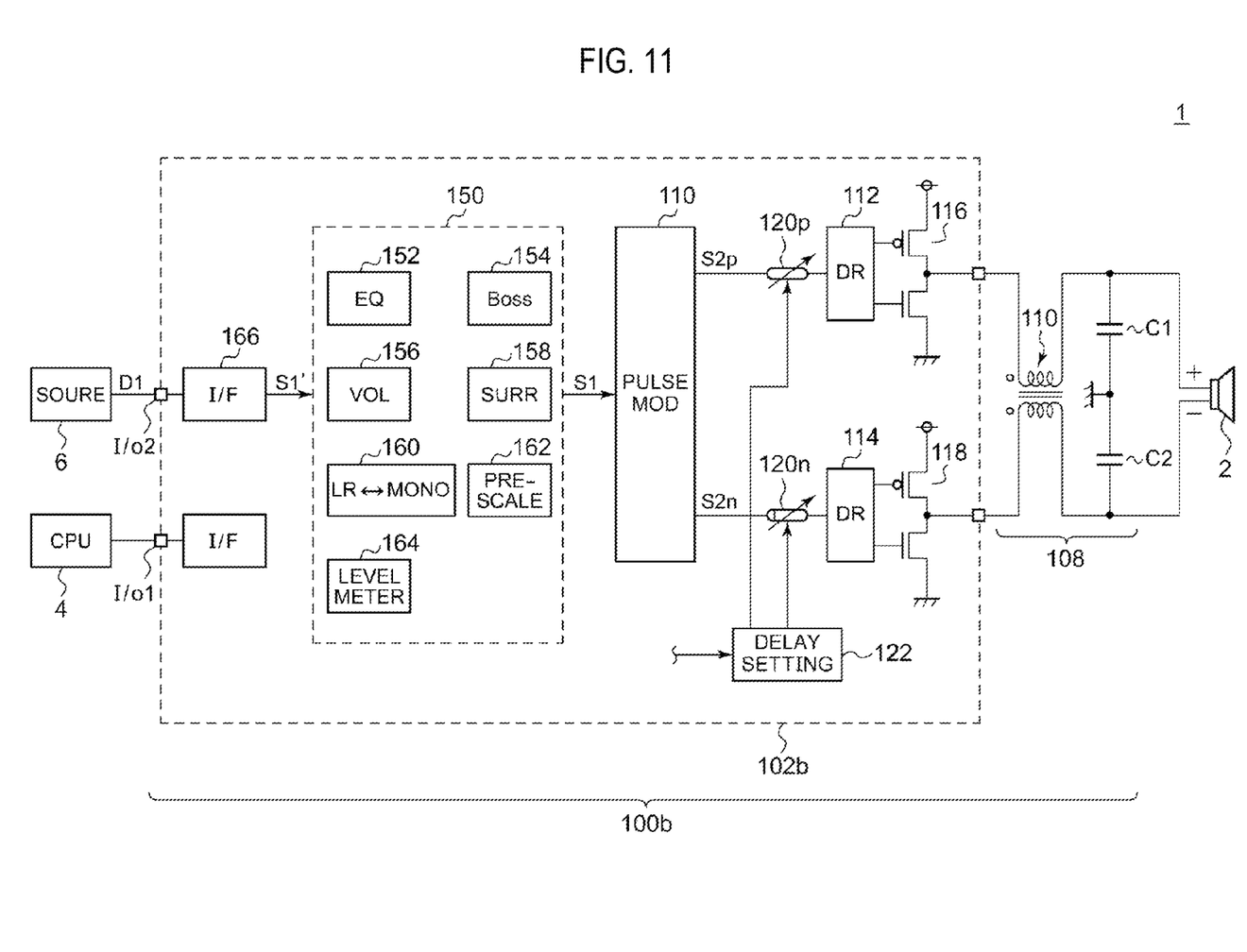
FIG. 11 is a circuit diagram showing an electronic device including the audio output circuit, according to some embodiments.

Finally, an application of the audio output circuit 100 will be described. FIG. 11 is a circuit diagram showing an electronic device 1 including the audio output circuit 100b.

The electronic device 1 includes a CPU 4 and a sound source 6 in addition to the audio output circuit 100b. The sound source 6 and an I/O terminal I/O2 of the audio IC 102b are connected via an I²S bus or the like. The sound source 6 generates a digital audio data D1.

The audio IC 102b includes a DSP (Digital Sound Processor) 150 provided ahead of the pulse modulator 110 and an audio interface circuit 166. The audio interface circuit 166 receives the digital audio data D1 from the sound source 6 and outputs the audio signal S1' to the DSP 150.

The DSP 150 performs various signal processing on the audio signal S1'. For example, the DSP 150 includes at least one of an equalizer 152, a bass booster circuit 154, a volume circuit 156, a surround circuit 158, a stereo/mono converting circuit 160, a pre-scaler 162, and a level meter 164.

The equalizer 152 performs an equalizing process on the audio signal S1'. The bass boost circuit 154 performs a low-frequency emphasizing process on the audio signal S1'. The volume circuit 156 performs a volume adjusting process on the audio signal S1'. The surround circuit 158 performs a surrounding process on the audio signal S1'. The stereo/mono converting circuit 160 performs a stereo/mono converting process on the audio signal S1'. The pre-scaler 162 performs a frequency conversion on the audio signal S1'. The level meter 164 detects the level of the audio signal S1'. Each unit can be switched on/off separately, and an order of processes can be set arbitrarily.

The delay setting circuit 122 sets the delay τ of the variable delay circuit 120, based on a data from the CPU 4 or a command value from the DSP 150.

Figure 12A:
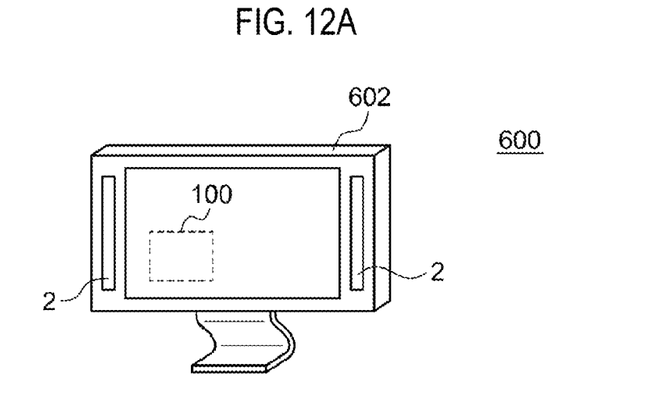
FIGS. 12A to 12C are external views of the electronic device, according to some embodiments.
Figure 12B:
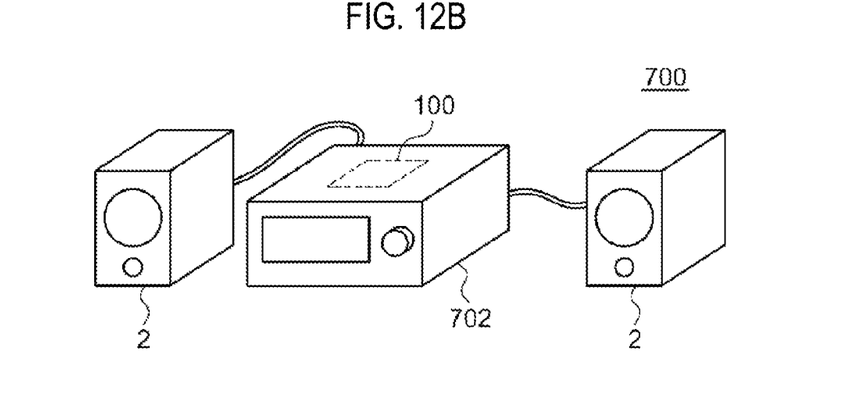
Figure 12C:
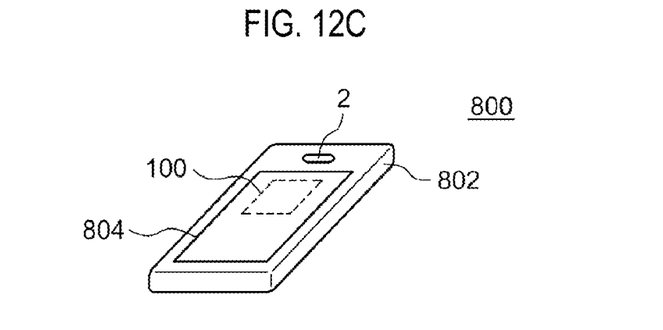

FIGS. 12A to 12C are diagrams showing the appearance of electronic devices including the audio output circuit 100. FIG. 12A shows a display device 600 as an example of the electronic device 1. The display device 600 includes a housing 602 and speakers 2. The audio output circuit 100 is built in the housing 602 to drive speakers 2.

FIG. 12B shows an audio apparatus 700 as an example of the electronic device 1. The audio apparatus 700 includes a housing 702, speakers 2. The audio output circuit 100 is built in the housing 702 to drive the speakers 2.

FIG. 12C shows a small information terminal 800 as an example of the electronic apparatus 1. The small information terminal 800 may be a mobile phone, a PHS (Personal Handyphone System), a PDA (Personal Digital Assistant), a tablet PC (Personal Computer), an audio player or the like. The small information terminal 800 includes a housing 802, a speaker 2, and a display 804. The audio output circuit 100 is built in the housing 802 to drive the speaker 2.

It is possible to use the common mode choke coil 140, while suppressing the deterioration of sound quality, by using the audio output circuit 100 in the electronic device as shown in FIGS. 12A to 12C, thus making it possible to miniaturize the housing or mount another circuit components on the location where the power inductor was originally placed.

It is also possible to reduce the size of the audio output circuit.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An audio output circuit for driving an electro-acoustic transducer, comprising:
    a first D-class amplifier;
    a second D-class amplifier;
    a pulse modulator configured to receive an audio signal to generate a first pulse signal and a second pulse signal for driving the first D-class amplifier and the second D-class amplifier, respectively;
    a first driver configured to drive the first D-class amplifier in response to the first pulse signal;
    a second driver configured to drive the second D-class amplifier in response to the second pulse signal;
    a common mode choke coil including a first coil, a second coil, and a core around which the first coil and the second coil are wound, one end of the first coil being connected to an output terminal of the first D-class amplifier and the other end of the first coil being connected to a positive terminal of the electro-acoustic transducer, and one end of the second coil being connected to an output terminal of the second D-class amplifier and the other end of the second coil being connected to a negative terminal of the electro-acoustic transducer; and
    a delay setting circuit configured to apply a relative delay to an output signal of the first D-class amplifier and an output signal of the second D-class amplifier.

2. The audio output circuit of claim 1, wherein the delay setting circuit sets the delay so as to reduce a total harmonic distortion+noise (THD+N).

3. The audio output circuit of claim 1, wherein the delay setting circuit changes the delay depending on a level of the audio signal.

4. The audio output circuit of claim 3, further comprising a level meter configured to detect the level of the audio signal, and
    wherein the delay setting circuit sets the delay depending on the detection of the level meter.

5. The audio output circuit of claim 3, further comprising a volume circuit provided ahead of the pulse modulator, wherein
    the volume circuit is configured to change an amplitude of the audio signal depending on a set volume level, and
    the delay setting circuit sets the delay depending on the volume level.

6. The audio output circuit of claim 1, further comprising:
    an interface circuit configured to receive a data indicating the delay from an external processor; and
    a register configured to store the received data,
    wherein the delay setting circuit sets the delay based on the data stored in the register.

7. The audio output circuit of claim 1, wherein an upper limit of a range within which the delay is adjustable is 100 ns or more.

8. The audio output circuit of claim 1, wherein a lower limit of a range within which the delay is adjustable is 0 ns, and an upper limit of the range is 300 ns or more.

9. The audio output circuit of claim 1, further comprising:
   a first capacitor, one end of the first capacitor being connected to a positive terminal of the electro-acoustic transducer and the other end of the first capacitor being grounded; and
   a second capacitor, one end of the second capacitor being connected to a negative terminal of the electro-acoustic transducer and the other end of the second capacitor being grounded.

10. The audio output circuit of claim 1, further comprising a third capacitor, and
   wherein one end of the third capacitor is connected to a positive terminal of the electro-acoustic transducer and the other end is connected to a negative terminal of the electro-acoustic transducer.

11. The audio output circuit of claim 1, further comprising a digital sound processor provided ahead of the pulse modulator, and
   wherein the digital sound processor is configured to perform at least one of equalizing, low-frequency emphasizing, surrounding, stereo converting, mono converting, frequency converting, and level detecting processes on the audio signal.

12. An electronic device, comprising:
   an electro-acoustic transducer; and
   the audio output circuit of claim 1 for driving the electro-acoustic transducer.

13. The electronic device of claim 12, further comprising a sound source configured to generate an audio data, and
   wherein the audio output circuit generates the audio signal based on the audio data.

14. An audio integrated circuit comprising an audio output circuit configured to drive an electro-acoustic transducer, along with a common mode choke coil, the common mode choke coil including a first coil whose one end is connected to a positive terminal of the electro-acoustic transducer, a second coil whose one end is connected to a negative terminal of the electro-acoustic transducer, and a core around which the first coil and the second coil are wound, the audio integrated circuit comprising:
   a first D-class amplifier, an output terminal of the first D-class amplifier being connected to the other end of the first coil;
   a second D-class amplifier, an output terminal of the second D-class amplifier being connected to the other end of the second coil;
   a pulse modulator configured to receive an audio signal to generate a first pulse signal and a second pulse signal for driving the first D-class amplifier and the second D-class amplifier, respectively;
   a first driver configured to drive the first D-class amplifier in response to the first pulse signal;
   a second driver configured to drive the second D-class amplifier in response to the second pulse signal; and
   a delay setting circuit configured to apply a relative delay to an output signal of the first D-class amplifier and an output signal of the second D-class amplifier.

15. The audio integrated circuit of claim 14, wherein the delay setting circuit sets the delay so as to reduce a total harmonic distortion+noise (THD+N).

16. The audio integrated circuit of claim 14, wherein the delay setting circuit changes the delay depending on a level of the audio signal.

* * * * *